(12) United States Patent
Shin et al.

(10) Patent No.: US 6,489,900 B2
(45) Date of Patent: Dec. 3, 2002

(54) BUS ENCODING/DECODING APPARATUS AND METHOD

(75) Inventors: Young-soo Shin, Seoul (KR); Ki-young Choi, San 56-1 Shillim 9-dong, Kwanak-gu, Seoul (KR); Byung-ho Min, Seoul (KR); Young-hoon Chang, Kyungki-do (KR)

(73) Assignees: Samsung Electronics Co., Ltd. (KR); Ki-young Choi (KR)

( * ) Notice: Subject to any disclaimer, the term of this patent is extended or adjusted under 35 U.S.C. 154(b) by 0 days.

(21) Appl. No.: 09/749,812

(22) Filed: Dec. 28, 2000

(65) Prior Publication Data

US 2001/0013838 A1 Aug. 16, 2001

(30) Foreign Application Priority Data

Dec. 30, 1999 (KR) .............................. 99-66030

(51) Int. Cl.[7] .............................. H03M 7/00; H03M 7/34
(52) U.S. Cl. .............................. 341/50; 341/51; 341/58; 708/706; 714/758; 714/712
(58) Field of Search .............................. 341/50, 51, 58, 341/65, 143; 714/6, 758, 720, 736, 30; 710/307; 365/230.05; 708/706

(56) References Cited

U.S. PATENT DOCUMENTS

| | | | | |
|---|---|---|---|---|
| 4,499,454 A | * | 2/1985 | Shimada .................... 341/58 |
| 5,497,341 A | * | 3/1996 | Cohen ...................... 708/706 |
| 5,617,531 A | * | 4/1997 | Crouch et al. .............. 714/30 |
| 5,659,549 A | * | 8/1997 | Oh et al. .................. 714/720 |
| 5,696,791 A | * | 12/1997 | Yeung ...................... 341/143 |
| 5,734,341 A | * | 3/1998 | Walker ..................... 341/58 |
| 5,825,824 A | * | 10/1998 | Lee et al. ................. 341/58 |
| 5,887,003 A | * | 3/1999 | Ranson et al. ............. 714/736 |
| 5,923,681 A | * | 7/1999 | Denton ..................... 714/758 |

* cited by examiner

Primary Examiner—Michael Tokar
Assistant Examiner—Jean Bruner Jeanglaude
(74) Attorney, Agent, or Firm—Burns, Doane, Swecker & Mathis, LLP (57) ABSTRACT

A bus encoding/decoding apparatus and method for a low power digital signal processor (DSP), which uses a narrow data bus, is provided. The apparatus for encoding n bits of data of a data bus, includes a conditional inverting unit for inverting each of (n−1) lower bits of n data when the most significant bit of the n bits of data is 1, a storage unit for storing the last n bits of data which is output to the bus, and a first exclusive OR operating unit for performing a bitwise exclusive OR operation on the lower (n−1) bits or data, which has been inverted by the conditional inverting unit, and the lower (n−1) bits of the n data, which has been stored in the storage unit, wherein the most significant bit of the n bits of data and (n−1) bits of data, which is obtained as the result of the bitwise exclusive OR operation performed by the first exclusive OR operating unit, are output. Accordingly, interface problems with a core and overhead for an additional circuit can be reduced by removing the additional circuit for determining whether to invert data and an extra line, which are used in the conventional BI and BITS coding methods, thereby decreasing the power consumption and the area of a chip.

10 Claims, 6 Drawing Sheets

BUS ENCODING/DECODING APPARATUS AND METHOD

BACKGROUND OF THE INVENTION

1. Field of the Invention

The present invention relates to a bus encoding/decoding apparatus, and more particularly, to a bus encoding/decoding apparatus and method for a low power digital signal processor (DSP) which uses a narrow data bus.

2. Description of the Related Art

As a System On a Chip (SOC) technique has been rapidly developed, various functional blocks can be installed on a single chip, and thus the chip requires a greater number of pins for interface with the outside. Since an increase in the number of pins increases the cost and power consumption of a chip, a method for efficiently using a limited number of pins is desired.

According to a narrow data bus scheme, problems caused due to lack of pins can be reduced when a decrease in performance due to wait cycles is permitted to some extent. A narrow data bus refers to a data bus having a smaller number of lines than the number of bits of data which is processed in an encoder or a decoder. Furthermore, a bus coding method, which minimizes the power consumption in the capacitance of a pin, is used to reduce the power consumption. For this method, a method for reducing transition between a current signal and a previous signal when data is transmitted via a bus, can be considered.

Figure 1A:
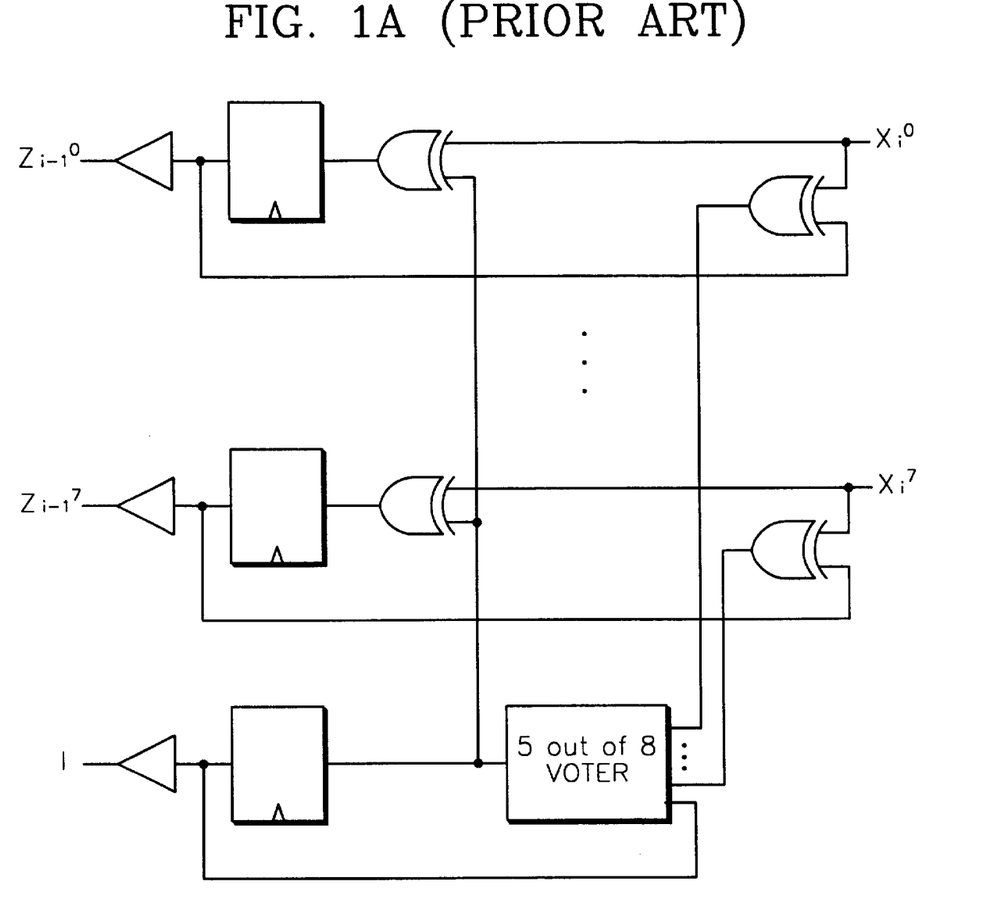
FIGS. 1A and 1B are circuit diagrams illustrating a conventional bus-invert (BI) encoder and a conventional BI decoder, respectively.
Figure 1B:
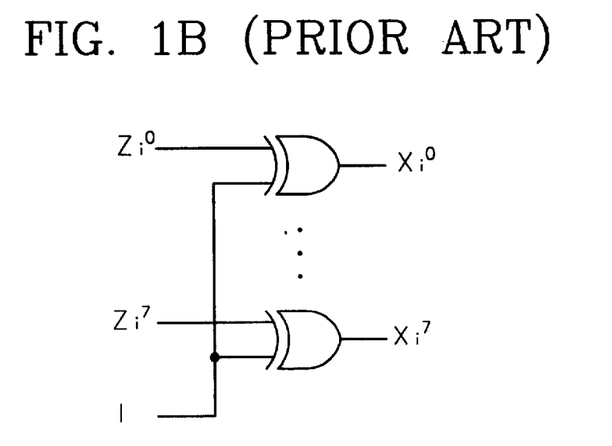
Figure 2A:
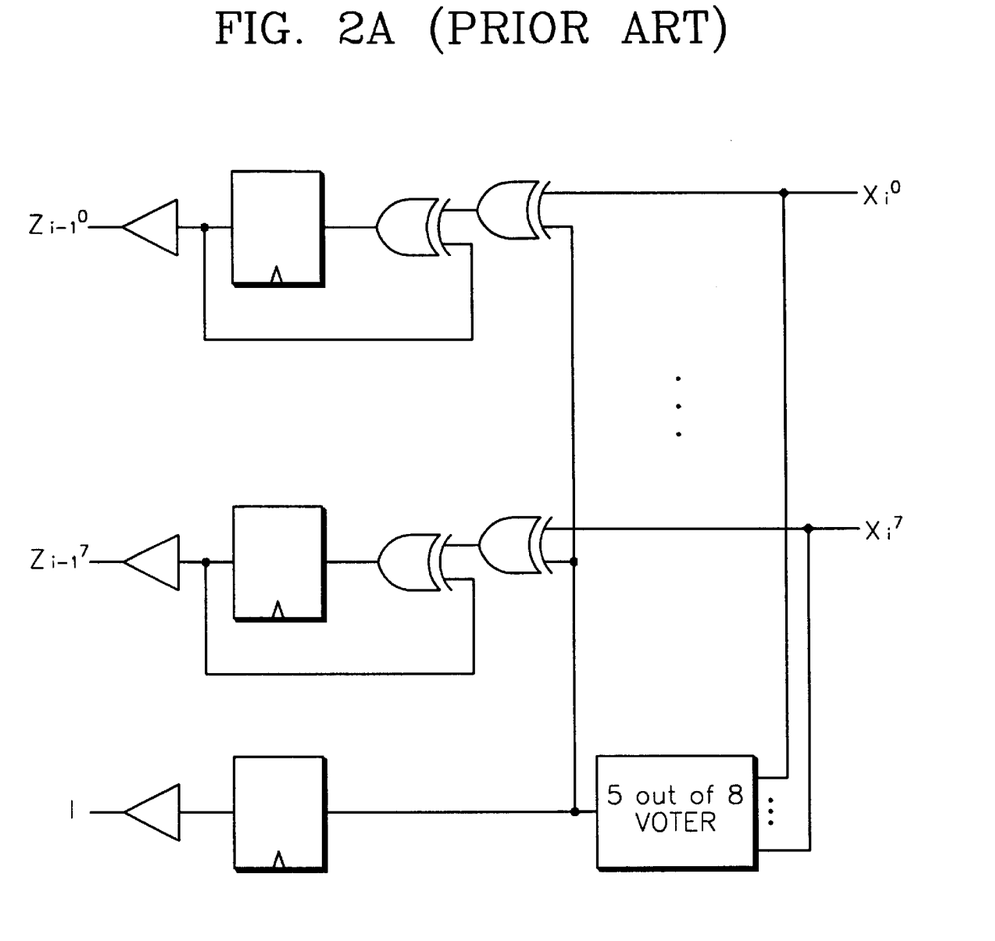
FIGS. 2A and 2B are circuit diagrams illustrating a conventional bus invert with transition signaling (BITS) encoder and a conventional BITS decoder, respectively.
Figure 2B:
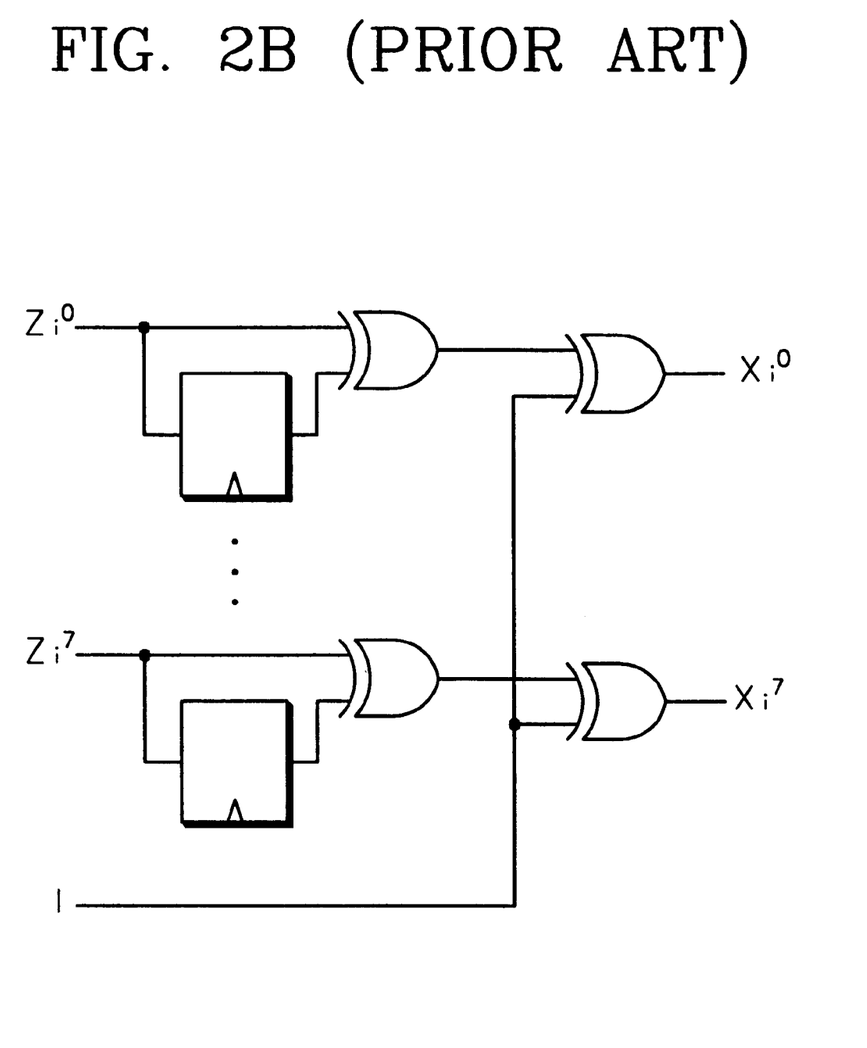

A bus-invert (BI) coding method and a bus inverting with transition signaling (BITS) coding method are conventional. FIGS. 1A and 1B show an encoder and a decoder, respectively, according to a BI coding method. FIGS. 2A and 2B show an encoder and a decoder, respectively, according to a BITS coding method.

The BI coding method is efficient in reducing power consumption with respect to a random data pattern, but is not efficient with respect to a data pattern such as speech or music. This is because the data pattern such as speech or music has a format of a two's complement, for example, in the case of data of 16 bits, 0 or 1 is concentrated in the upper 8 bits.

Like the BI coding method, the BITS coding method requires an extra circuit, which determines whether to invert an extra line and data, and thus overhead becomes larger. Consequently, since the conventional coding methods for the narrow bus require an additional pin for the extra line, they restrict use of a core which is manufactured in advance.

SUMMARY OF THE INVENTION

To solve the above problem, an object of the present invention is to provide a narrow bus encoding/decoding apparatus and method for reducing interface problems with a core and reducing overhead for an additional circuit by removing the additional circuit referred to as a majority voter, which determines whether to invert data, and an extra line, which are used in the conventional BI and BITS coding methods, thereby decreasing the power consumption and the area of a chip.

To achieve the above object of the invention, there is provided an apparatus for encoding n bits of data of a data bus, including a conditional inverting unit for inverting each of (n−1) lower bits of n data when the most significant bit of the n bits of data is 1, a storage unit for storing the last n bits of data which is output to the bus, and a first exclusive OR operating unit for performing a bitwise exclusive OR operation on the lower (n−1) bits of the n data, which has been inverted by the conditional inverting unit, and the lower (n−1) bits of data, which has been stored in the storage unit. The most significant bit of the n bits of data and (n−1) bits of data, which is obtained as the result of the exclusive OR operation performed by the first exclusive OR operating unit, are output.

The conditional inverting unit is a second exclusive OR operating unit which performs an exclusive OR operation on each of the lower (n−1) bits of the n bits of data and the most significant bit of the n bits of data.

To achieve the above object of the invention, there is also provided an apparatus for decoding n bits of encoded data of a data bus, including a storage unit for storing the lower (n−1) bits of data of a previous encoded n bits of data which is input from the bus; a first exclusive OR operating unit for performing a bitwise exclusive OR operation on the lower (n−1) bits of data of encoded current n bits of data, which is input from the bus following the previous n bits of data, and the lower (n−1) bits of data, which is stored in the storage unit; and a conditional inverting unit for inverting (n−1) bits of data, which is obtained as the result of the bitwise exclusive OR operation performed by the first exclusive OR operating unit, when the most significant bit of the current n bits of data, which is input from the bus, is 1. The most significant bit of the current n bits of data, which is input from the bus, and (n−1) bits of data, which is obtained as the result of the inversion performed by the conditional inverting unit, are output.

The conditional inverting unit is a second exclusive OR operating unit, which performs a bitwise exclusive OR operation on the (n−1) bits of data output from the first exclusive OR operating unit and the most significant bit of the current n bits of data in bit units.

To achieve the above object of the invention, there is provided a method for encoding n-bit data of a data bus, including the steps of (a) inverting each of (n−1) lower bits of data when the most significant bit of the n bits of data is 1, (b) performing a bitwise exclusive OR operation on the lower (n−1) bits of data, which has been conditionally inverted in the step (a), and the lower (n−1) bits of data, which has last been encoded, and (c) outputting the most significant bit of the n bits of data and (n−1) bits of data, which is obtained as the result of the exclusive OR operation.

To achieve the above object of the invention, there is also provided a method for decoding n bits of encoded data of a data bus, including the steps of (a) storing the lower (n−1) bits of data of a previous encoded n bits of data which is input from the bus, (b) performing a bitwise exclusive OR operation on the lower (n−1) bits of data of encoded current n bits of data, which is input from the bus following the previous n-bit data, and the lower (n−1) bits of data, which is stored in the step (a), (c) inverting each of (n−1) bits of data, which is obtained as the result of the bitwise exclusive OR operation, when the most significant bit of the current n bits of data, which is input from the bus, is 1, and (d) outputting the most significant bit of the current n-bit data, which is input from the bus, and (n−1)-bit data, which is obtained as the result of the conditional inversion performed in the step (c).

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 3A:
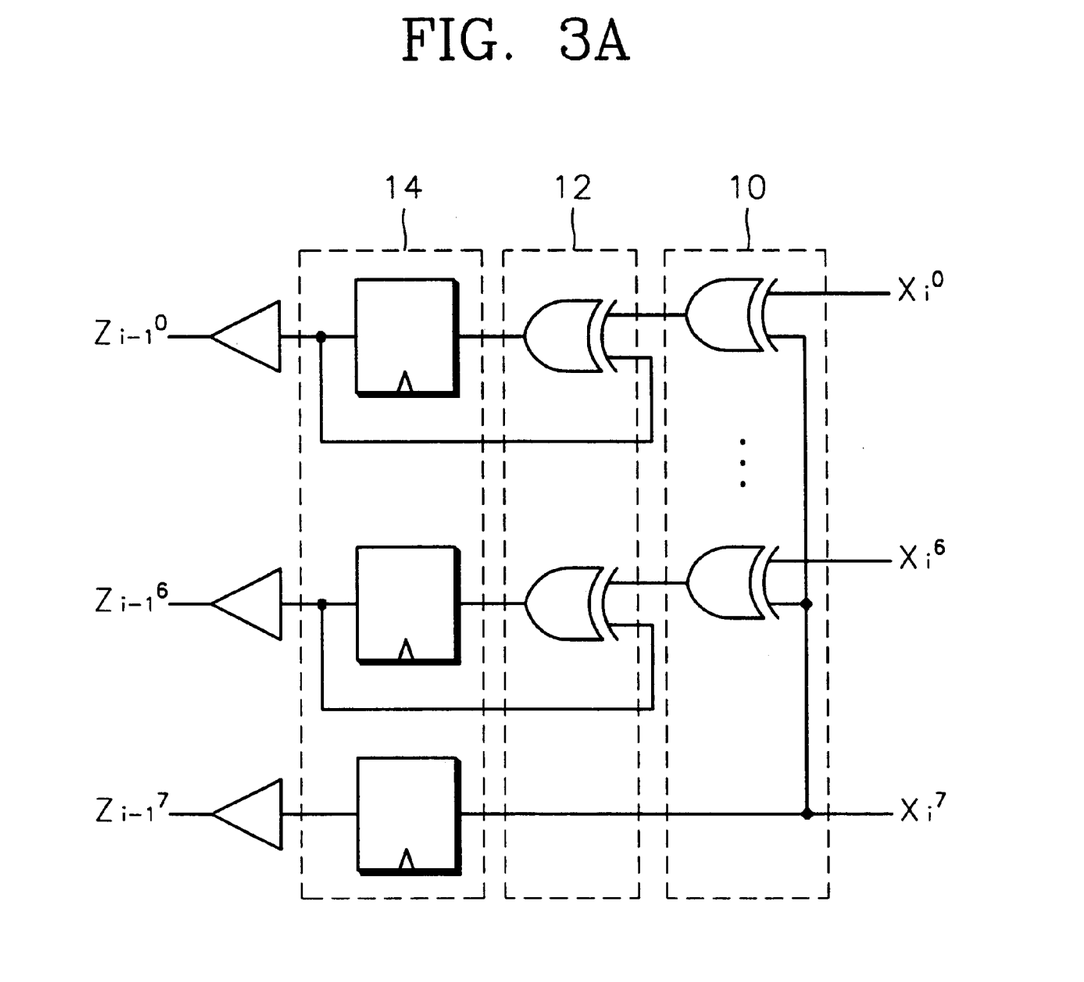
FIGS. 3A and 3B are circuit diagrams illustrating a half identity half reverse (HIHR) encoder and a HIHR decoder according to the present invention.

Referring to FIG. 3A, an embodiment of an apparatus for encoding 8 bits of data of a data bus includes a conditional inverter 10, a storage unit 14 and a first exclusive OR operating unit 12. The 8-bit data bus is used in FIG. 3A, but the number of bits of a data bus is not limited thereto in the present invention.

When the value of the most significant bit $X_i^7$ of the 8 bits of data $X_i^0, \ldots, X_i^6, X_i^7$ is 1, the conditional inverter 10 inverts each of the lower 7 bits $X_i^0, \ldots, X_i^5, X_i^6$. In the embodiment of an encoder according to the present invention as shown in FIG. 3A, the conditional inverter 10 is preferably composed of 7 exclusive OR gates which perform an exclusive OR operation on the lower 7 bits $X_i^0, \ldots, X_i^5, X_i^6$ of data and the most significant bit $X_i^7$.

The storage unit 14 stores 8 bits of data $X_i^0, \ldots, X_i^6, X_i^7$, which are output to a bus, and is preferably composed of 8 latches.

The first exclusive OR operating unit 12 performs an exclusive OR operation on the lower 7 bits of data, which are inverted by the conditional inverter 10, and the corresponding lower 7 bits $X_i^0, \ldots, X_i^5, X_i^6$ of data, which are stored in the storage unit 14. The first exclusive OR operating unit 12 is preferably composed of 7 exclusive OR gates.

The 7 bits of data, which are obtained as the result of the exclusive OR operation by the first exclusive OR operating units, and the most significant bit of the 8 bits of data are output to a bus via the storage unit 14.

Figure 3B:
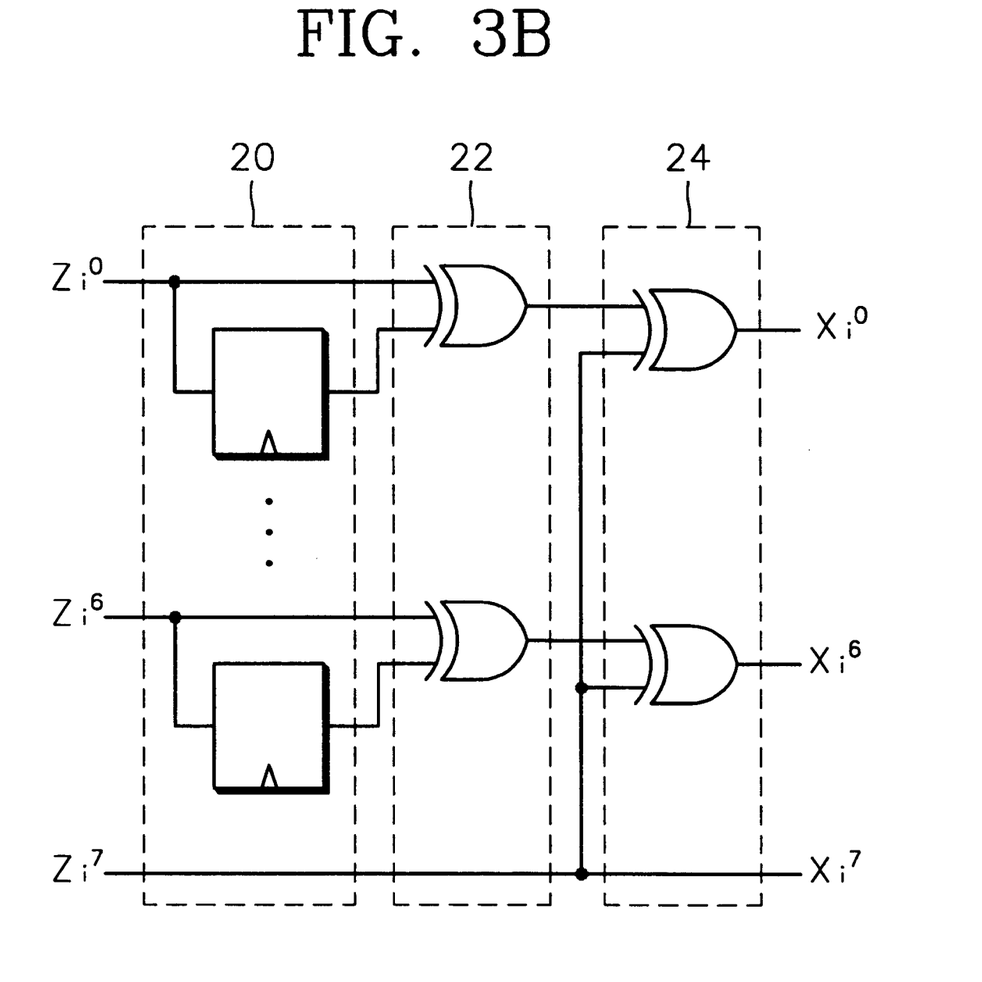

Referring to FIG. 3B, an embodiment of an apparatus for decoding the 8 bits of data, which have been encoded, of a data bus includes a storage unit 20, a first exclusive OR operating unit 22 and a conditional inverter 24. An 8-bit data bus is used in FIG. 3B, but the number of bits of a data bus is not limited thereto in the present invention.

The storage unit 20 stores the lower 7 bits $Z_{i-1}^0, \ldots, Z_{i-1}^5, Z_{i-1}^6$ among previous 8 bits $Z_{i-1}^0, \ldots, Z_{i-1}^6, Z_{i-1}^7$ of data, which have been encoded and input from the bus, and is preferably composed of 7 latches.

The first exclusive OR operating unit 22 performs an exclusive OR operation on the lower 7 bits $Z_i^0, \ldots, Z_i^5, Z_i^6$ among current 8 bits $Z_i^0, \ldots, Z_i^6, Z_i^7$ of data, which have been encoded and input from the bus following the previous 8 bits $Z_{i-1}^0, \ldots, Z_{i-1}^6, Z_{i-1}^7$ of data, and the corresponding lower 7 bits $Z_{i-1}^0, \ldots, Z_{i-1}^5, Z_{i-1}^6$ of data, which are stored in the storage unit 20. The first exclusive OR operating unit 22 is preferably composed of 7 exclusive OR gates.

When the value of the most significant bit $Z_i^7$ among the current 8 bits of data, which have been encoded and input from the bus, is 1, the conditional inverter 24 inverts each of the 7 bits of data, which are obtained as the result of the exclusive OR operation by the first exclusive OR operating unit 22. In the embodiment of a decoder according to the present invention as shown in FIG. 3B, the conditional inverter 24 is preferably composed of 7 exclusive OR gates which perform an exclusive OR operation on the lower 7 bits of data, which are obtained as the result of the exclusive OR operation in the first exclusive OR operating unit 22, and the most significant bit $Z_i^7$.

The most significant bit among the current 8 bits of data, which have been encoded and input from the bus, and the 7 bits of data, which have been inverted by the conditional inverter 24, are output as decoded data.

Hereinafter, a coding method of the present invention is referred to as a half identity half reverse (HIHR) coding method compared to the conventional bus-invert (BI) and bus inverting with transition signaling (BITS) coding methods.

The operation of the present invention will be described with an example of a human voice having the following data patterns.

| | | |
|---|---|---|
| 5.683954 | 0000010110101111 | X0: 00000101, X1: 10101111 |
| 10.578125 | 0000101010010100 | X2: 00001010, X3: 10010100 |
| −5.625000 | 1111101001100000 | X4: 11111010, X5: 01100000 |
| 1.019531 | 0000000100000100 | X6: 00000001, X7: 00000100 |
| 3.484375 | 0000001101111100 | X8: 00000011, X9: 01111100 |

The first column shows voice data patterns which are expressed as decimal numbers. The second column shows voice data patterns which are expressed as 16-bit two's complement fixed points. The third column shows voice data patterns which are expressed as formats for transmission to an 8-bit data bus.

When 16 bits of data in the second column are transmitted via an 8-bit bus, the 16 bits of data are divided as shown in the third column and transmitted in the order of X0, X1, . . . and X9.

When 8 bits of data are transmitted, it is coded according to a rule as shown in Equation 1.

$$Y_i = \begin{cases} x_i^{n-1} | X_i(n-1), & \text{if } x_i^{n-1} = 0 \\ x_i^{n-1} | \overline{X_i(n-1)}, & \text{otherwise} \end{cases} \quad (1)$$

$$Z_i = y_i^{n-1} | TS(Y_i(n-1), Z_{i-1}(n-1))$$

In other words, since X0=00000101, if the $Y_i$ equation is first adopted, inverting is not performed since the most significant bit is 0, and thus Y1=00000101. If the $Z_i$ equation is then adopted, a bitwise exclusive OR operation is performed on the remaining 7 bits except for the most significant bit of Y1 and data Z0 which was loaded on the bus immediately before the current data, and thus Z1 maintains 00000101. At this time, it is regarded that Z0 is initialized to 00000000.

Accordingly, Z1 is loaded on the bus. For the next value X1=10101111, since the most significant bit is 1, X1 is inverted to Y2=11010000. The most significant bit of Y2 becomes the most significant bit of Z2, and an exclusive OR operation is performed on the lower 7 bits of Y2 and the lower 7 bits of Z1. Then, 1|TR(Y2,Z1)=1|TR(1010000, 0000101) becomes 1 and 1010101, so Z2 is 11010101. Thereafter, Z2 is loaded on the bus.

The data patterns of the human voice exemplified above are encoded as follows when the HIHR coding method of the present invention is adopted.

| X | Y | Z |
|---|---|---|
| X0: 00000101 | ---->00000101 | ---->00000101 |
| X1: 10101111 | ---->11010000 | ---->11010101 |
| X2: 00001010 | ---->00001010 | ---->01011111 |
| X3: 10010100 | ---->11101011 | ---->10110100 |
| X4: 11111010 | ---->10000101 | ---->10110001 |
| X5: 01100000 | ---->01100000 | ---->01010001 |
| X6: 00000001 | ---->00000001 | ---->01010000 |
| X7: 00000100 | ---->00000100 | ---->01010100 |
| X8: 00000011 | ---->00000011 | ---->01010111 |
| X9: 01111100 | ---->01111100 | ---->00101011 |

In the HIHR coding method of the present invention, the decoding process is the reverse of the encoding process and expressed as Equation 2.

$$Y_i = z_i^{n-1} | TS(Z_i(n-1), Z_{i-1}(n-1)) \quad (2)$$

$$X_i = \begin{cases} y_i^{n-1}|Y_i(n-1), & \text{if } z_i^{n-1} = 0 \\ y_i^{n-1}|\overline{Y_i(n-1)}, & \text{otherwise} \end{cases}$$

With respect to the conventional BI and BITS coding methods and the HIHR coding method according to the present invention, the numbers of transitions are compared as follows. First, the numbers of transitions in the BI coding method are shown.

| X | Z | Number of transitions |
|---|---|---|
| X0: 00000101 | ---->000001010 | 0 |
| X1: 10101111 | ---->101011110 | 4 |
| X2: 00001010 | ---->000010100 | 4 |
| X3: 10010100 | ---->011010111 | 4 |
| X4: 11111010 | ---->111110100 | 4 |
| X5: 01100000 | ---->011000000 | 4 |
| X6: 00000001 | ---->000000010 | 3 |
| X7: 00000100 | ---->000001000 | 2 |
| X8: 00000011 | ---->000000110 | 3 |
| X9: 01111100 | ---->100000111 | 2 = 30 transitions |

In the BI coding method, an original signal is inverted when the number of transitions between the original signal and the previous signal exceeds half of a bus width.

The numbers of transitions in the BITS coding method are shown.

| Number of 1s | Y\|I | Z\|I | Number of transitions |
|---|---|---|---|
| X0: 00000101 | ---->000001010 | ---->000001010 | |
| X1: 10101111 | ---->010100001 | ---->010101011 | 3 |
| X2: 00001010 | ---->000010100 | ---->010111110 | 3 |
| X3: 10010100 | ---->100101000 | ---->110010110 | 3 |
| X4: 11111010 | ---->000000111 | ---->110011101 | 3 |
| X5: 01100000 | ---->011000000 | ---->101011100 | 3 |
| X6: 00000001 | ---->000000010 | ---->101011110 | 1 |
| X7: 00000100 | ---->000001000 | ---->101010110 | 1 |
| X8: 00000011 | ---->000000110 | ---->101010000 | 2 |
| X9: 01111100 | ---->100000111 | ---->001010111 | 4 = 23 transitions |

Unlike the BI coding method, the BITS coding method determines whether to perform inverting based on the number of 1s in an original signal. When the number of 1s exceeds half of a bus width, inversion is performed.

Finally, the numbers of transitions in the HIHR coding method of the present invention are shown.

| X | Y | Z | Number of transitions |
|---|---|---|---|
| X0: 00000101 | ---->00000101 | ---->00000101 | |
| X1: 10101111 | ---->11010000 | ---->11010101 | 3 |
| X2: 00001010 | ---->00001010 | ---->01011111 | 3 |
| X3: 10010100 | ---->11101011 | ---->10110100 | 6 |
| X4: 11111010 | ---->10000101 | ---->10110001 | 2 |
| X5: 01100000 | ---->01100000 | ---->01010001 | 3 |
| X6: 00000001 | ---->00000001 | ---->01010000 | 1 |
| X7: 00000100 | ---->00000100 | ---->01010100 | 1 |
| X8: 00000011 | ---->00000011 | ---->01010111 | 2 |
| X9: 01111100 | ---->01111100 | ---->00101011 | 5 = 26 transitions |

According to the HIHR coding method of the present invention, Y data is created using the most significant bit (MSB) of an original signal. If the MSB is 1, it is maintained and the remaining 7 bits of the original signal are inverted. If the MSB is 0, the original signal is maintained as it is. Next, a bitwise exclusive OR operation is performed on the Y data newly created and the previous Z data. The exclusive OR operation produces a logic 1 when operands are different and produces a logic 0 when operands are the same.

When the three methods are compared, the BITS coding method has the least transitions, and the HIHR coding method has less transitions than the BI coding method. However, the BITS coding method requires an extra line and an additional circuit. Accordingly, in aspect of a chip area and cost, the HIHR coding method is more effective.

TABLE 1

Comparison of the total numbers of transitions (speech and classic music)

| | | Unencoded | BI coding | | BITS coding | | HIHR coding | |
|---|---|---|---|---|---|---|---|---|
| Pattern names | # patterns | # trans. | # trans. | % red. | # trans. | % red. | # trans. | % red. |
| Speech output | 3276 | 12375 | 10423 | 15.8 | 6815 | 47.3 | 7348 | 40.6 |
| Classic music | 3276 | 13204 | 10690 | 19.0 | 8719 | 34.0 | 9585 | 27.4 |

TABLE 2

Comparison of the total numbers of transitions (results of FFT operation)

| | | Unencoded | BI coding | | BITS coding | | HIHR coding | |
|---|---|---|---|---|---|---|---|---|
| Pattern names | # patterns | # trans. | # trans. | % red. | # trans. | % red. | # trans. | % red. |
| FFTR data | 1566 | 7767 | 6375 | 17.9 | 3690 | 52.5 | 4337 | 44.2 |
| FFTI data | 1566 | 7714 | 6351 | 17.7 | 3684 | 52.2 | 4160 | 46.1 |

In Tables 1 and 2, the numbers of transitions in the three coding methods are compared. In this case, pattern data of 16 bits is divided into data of 8 bits, and then the three coding methods are applied to the 8 bits of data. After the application of the three coding methods, the numbers of transitions between data are compared. Table 1 shows experimental values with respect to speech and classic music, and Table 2 shows the results of fast Fourier transformation (FFT) operation.

The power consumption of a digital hearing aid to which the HIHR coding method is applied was measured. The HIHR coding method is applied when data was transmitted between an external memory and a digital signal process (DSP) core. In simulation, capacitance was changed within a range of 10–30 pF when the external memory was driven, and capacitance of 3 pF was used when an internal memory was driven. Power supply voltage of 3.3 V and a clock frequency of 10 MHz are used. Table 5 shows a case in which 16-bit pattern data is transmitted via an 8-bit data bus.

TABLE 3

Comparison of areas, delay and power of encoders and decoders

| | Encoder | | | Decoder | | |
|---|---|---|---|---|---|---|
| | BI | BITS | HIHR | BI | BITS | HIHR |
| Area ($\mu m^2$) | 19076 | 18626 | 4659 | 2662 | 11392 | 9968 |
| Delay (ns) | 3.29 | 3.87 | 0.38 | 0.15 | 0.38 | 0.38 |
| Power ($\mu W$) | 2309 | 2409 | 411 | 120 | 2102 | 1618 |

In Table 3, the area, delay and power of encoders and decoders, which are used in the three coding methods applied to a speech data pattern, are compared. As shown in Table 3, the encoder and decoder using the HIHR coding method of the present invention show the best performance when they are estimated synthetically based on the area, delay and power.

TABLE 4

Comparison of overall power consumption during OFF chip driving

| Pattern names | $C_{offchip}$ (pF) | Unencoded P(mW) | BI P(mW) | BI Red. (%) | BITS P(mW) | BITS Red. (%) | HIHR P(mW) | HIHR Red. (%) |
|---|---|---|---|---|---|---|---|---|
| Speech output | 10 | 27.9 | 28.2 | −1.1 | 18.1 | 35.1 | 17.6 | 36.9 |
| | 15 | 38.2 | 36.9 | 3.4 | 23.5 | 38.5 | 23.7 | 38.0 |
| | 20 | 48.5 | 45.6 | 6.0 | 28.9 | 40.4 | 29.8 | 38.6 |
| | 25 | 58.9 | 54.3 | 7.8 | 34.3 | 41.8 | 35.9 | 39.0 |
| | 30 | 69.1 | 63.0 | 8.8 | 39.7 | 42.5 | 42.0 | 39.2 |
| Classic music | 10 | 29.7 | 28.1 | 5.4 | 23.2 | 21.9 | 22.5 | 24.2 |
| | 15 | 40.7 | 36.7 | 9.8 | 30.4 | 25.3 | 30.4 | 25.3 |
| | 20 | 51.7 | 45.3 | 12.4 | 37.7 | 27.1 | 38.4 | 25.7 |
| | 25 | 62.6 | 53.9 | 13.9 | 44.9 | 28.3 | 46.3 | 26.0 |
| | 30 | 73.6 | 62.5 | 15.1 | 52.2 | 29.1 | 54.3 | 26.2 |

In Table 4, power consumption of encoders, which are used in the three coding methods applied to speech and classic musical, is measured and compared. As shown in Table 4, power saving of HIHR is achieved in a range of 36.9% at $C_{offchip}$=10 pF through 39.2% at $C_{offchip}$=30 pF. This power saving is nearly equal to that in the BITS coding method, but the HIHR coding method is better if the area of a chip and the cost for an extra line are considered.

TABLE 5

Comparison of the overall power consumption during OFF chip driving

| $C_{offchip}$ (pF) | Uncoded P(mW) | HIHR coding P(mW) | Red.(%) |
|---|---|---|---|
| 10 | 1.60 | 1.00 | 37.5 |
| 15 | 2.16 | 1.34 | 38.0 |
| 20 | 2.73 | 1.64 | 39.9 |
| 25 | 3.30 | 1.98 | 40.0 |
| 30 | 3.87 | 2.29 | 40.8 |

Table 5 shows values which were measured when only a latch and an output driver were considered. Power consumption of a decoder was 153 μW. Accordingly, as compared to an uncoded method, the HIHR coding method could save power of (1.6 mW-1 mW-0.153 mW)/(1.6 mW)=27.9% when $C_{offchip}$ was 10 pF, and power of (3.87 mW-2.29 mW-0.153 mW)/(3.87 mW)=36.9% when $C_{offchip}$ was 30 pF.

Figure 4A:
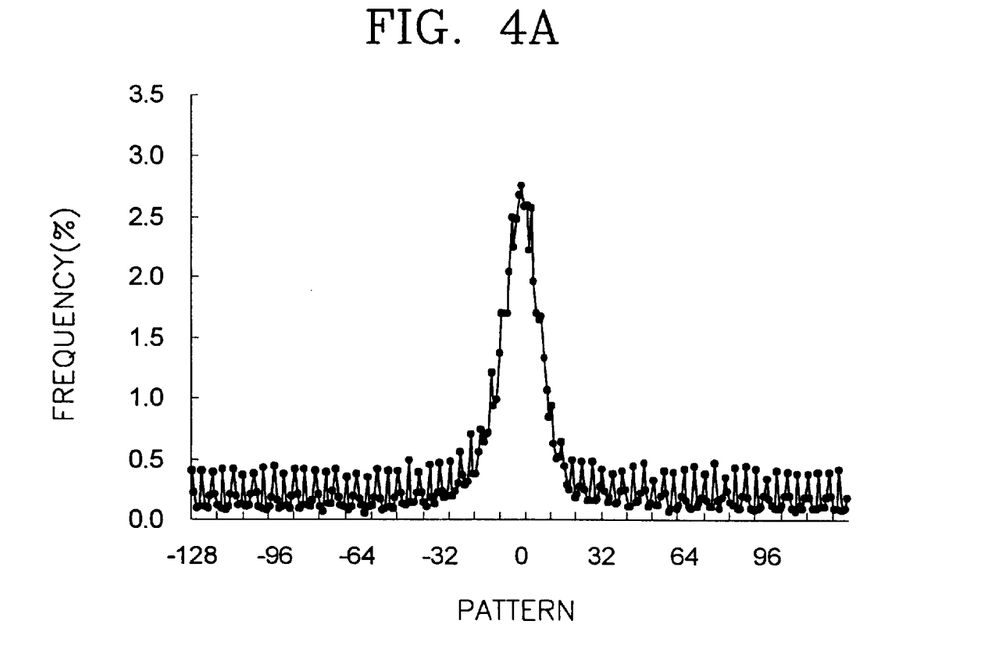
FIGS. 4A and 4B are graphs illustrating the frequencies of data patterns of a speech signal and the frequencies of data patterns of a music signal, respectively.
Figure 4B:
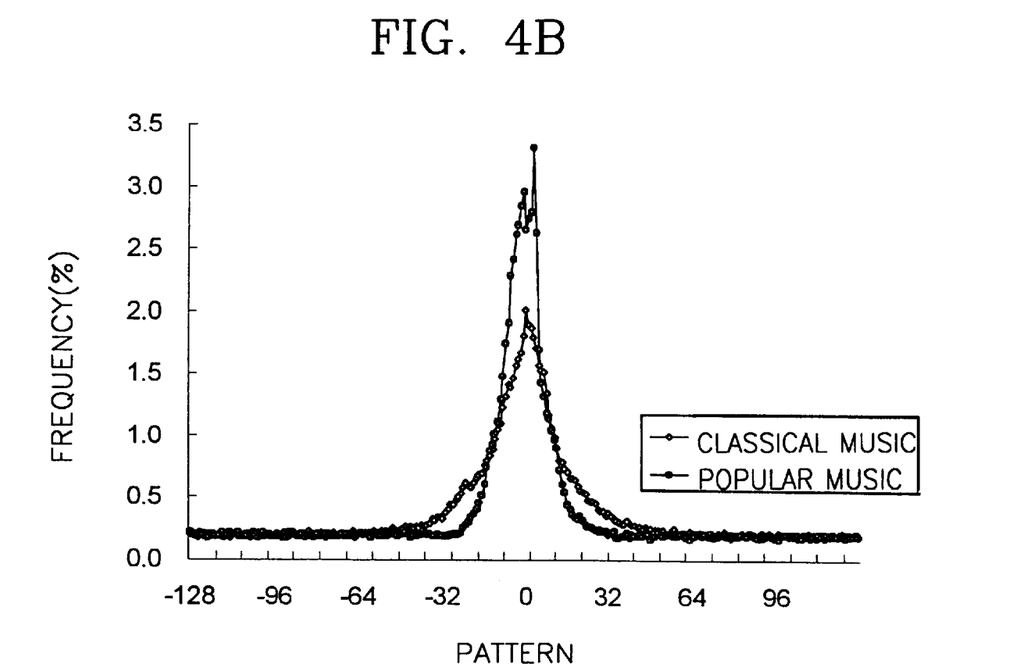

When 16-bit pattern data is transmitted via a 16-bit data bus, capacitance at the internal node of a chip is about 3 pF. In a simulation based on this, power consumption measured in an unencoded case was 1.63 mW. In the case of the HIHR coding method, the power consumption of an encoder and a decoder was 1.05 mW and 0.276 mW, respectively. Accordingly, the HIHR coding method could save power of (1.63 mW-1.05 mW-0.276 mW)/(1.63 mW)=18.7%. The HIHR coding method was created for a narrow data bus. The HIHR coding method is also effective when a large amount of data is gathered around 0 like speech or music pattern data as shown in FIGS. 4A and 4B, although a bus width and a data width are the same.

The present invention reduces interface problems with a core and overhead for an additional circuit by removing the additional circuit referred to as a majority voter, which determines whether to invert data, and an extra line, which are used in the conventional BI and BITS coding methods, thereby decreasing the power consumption and the area of a chip. In addition, when a bus width and a data width are the same, the present invention can reduce power consumption with respect to pattern data, which shows a distribution in which a large amount of data is gathered around 0, as well as a narrow data bus.

What is claimed is:

1. An apparatus for encoding n bits of data of a data bus, comprising:
   conditional inverting means for inverting each of (n–1) lower bits of n data when the most significant bit of the n bits of data is 1;
   storage means for storing the last n bits of data which is output to the bus; and
   first exclusive OR operating means for performing a bitwise exclusive OR operation on the lower (n–1) bits of the n data, which have been inverted by the conditional inverting means, and the lower (n–1) bits of data, which has been stored in the storage means,
   wherein the most significant bit of the n bits of data and (n–1) bits of data, which is obtained as the result of the exclusive OR operation performed by the first exclusive OR operating means, are output.

2. The apparatus of claim 1, wherein the conditional inverting means is second exclusive OR operating means which performs an exclusive OR operation on each of the lower (n–1) bits of the n bits of data and the most significant bit of the n bits of data.

3. An apparatus for decoding n bits of encoded data of a data bus, comprising:
   storage means for storing the lower (n–1) bits of data of a previous encoded n bits of data which is input from the bus;
   first exclusive OR operating means for performing a bitwise exclusive OR operation on the lower (n–1) bits of data of encoded current n bits of data, which are input from the bus following the previous n bits of data, and the lower (n–1) bits of data, which is stored in the storage means; and
   conditional inverting means for inverting (n–1) bits of data, which is obtained as the result of the bitwise exclusive OR operation performed by the first exclusive OR operating means, when the most significant bit of the current n bits of data, which is input from the bus, is 1,
   wherein the most significant bit of the current n bits of data, which is input from the bus, and (n–1) bits of data, which is obtained as the result of the inversion performed by the conditional inverting means, are output.

4. The apparatus of claim 3, wherein the conditional inverting means is second exclusive OR operating means, which performs a bitwise exclusive OR operation on the (n–1) bits of data output from the first exclusive OR operating means and the most significant bit of the current n bits of data in bit units.

5. A method for encoding n-bit data of a data bus, comprising the steps of:
   (a) inverting each of (n–1) lower bits of data when the most significant bit of the n bits of data is 1;
   (b) performing a bitwise exclusive OR operation on the lower (n–1) bits of data, which has been conditionally inverted in the step (a), and the lower (n–1) bits of data, which has last been encoded; and
   (c) outputting the most significant bit of the n bits of data and (n–1) bits of data, which is obtained as the result of the exclusive OR operation.

6. A method for decoding n bits of encoded data of a data bus, comprising the steps of:
   (a) storing the lower (n–1) bits of data of a previous encoded n bits of data which is input from the bus;
   (b) performing a bitwise exclusive OR operation on the lower (n–1) bits of data of encoded current n bits of data, which is input from the bus following the previous n-bit data, and the lower (n–1) bits of data, which is stored in the step (a);
   (c) inverting each of (n–1) bits of data, which is obtained as the result of the bitwise exclusive OR operation, when the most significant bit of the current n bits of data, which is input from the bus, is 1; and
   (d) outputting the most significant bit of the current n-bit data, which is input from the bus, and (n–1)-bit data, which is obtained as the result of the conditional inversion performed in the step (c).

7. A circuit for encoding n bits of data of a data bus, comprising:
   conditional inverting circuit which inverts each of (n–1) lower bits of n data when the most significant bit of the n bits of data is 1;
   a latch circuit which stores the last n bits of data which is output to the bus; and
   first exclusive OR circuit which performs a bitwise exclusive OR operation on the lower (n–1) bits of the n data, which have been inverted by the conditional inverting circuit, and the lower (n–1) bits of data, which has been stored in the latch circuit,
   wherein the most significant bit of the n bits of data and (n–1) bits of data, which is obtained as the result of the exclusive OR operation performed by the first exclusive OR circuit, are output.

8. The circuit of claim 7, wherein the conditional inverting circuit includes a second exclusive OR circuit which performs an exclusive OR operation on each of the lower (n–1) bits of the n bits of data and the most significant bit of the n bits of data.

9. A circuit for decoding n bits of encoded data of a data bus, comprising:
- a latch circuit which stores the lower (n−1) bits of data of a previous encoded n bits of data which is input from the bus;
- first exclusive OR circuit which performs a bitwise exclusive OR operation on the lower (n−1) bits of data encoded current n bits of data, which are input from the bus following the previous n bits of data, and the lower (n−1) bits of data, which is stored in the latch circuit; and
- conditional inverting circuit which inverts (n−1) bits of data, which is obtained as the result of the bitwise exclusive OR operation performed by the first exclusive OR circuit, when the most significant bit of the current n bits of data, which is input from the but, is 1, wherein the most significant bit of the current n bits of data, which is input from the bus, and (n−1) bits of data, which is obtained as the result of the inversion performed by the conditional inverting circuit, are output.

10. The apparatus of claim 9, wherein the conditional inverting circuit is second exclusive OR circuit, which performs a bitwise exclusive OR operation on the (n−1) bits of data output from the first exclusive OR circuit and the most significant bit of the current n bits of data in bit units.

* * * * *